United States Patent
Schildmann

(10) Patent No.: US 7,578,888 B2
(45) Date of Patent: Aug. 25, 2009

(54) METHOD FOR TREATING LASER-STRUCTURED PLASTIC SURFACES

(75) Inventor: Mark Peter Schildmann, Solingen (DE)

(73) Assignee: Enthone Inc., West Haven, CT (US)

(*) Notice: Subject to any disclaimer, the term of this patent is extended or adjusted under 35 U.S.C. 154(b) by 696 days.

(21) Appl. No.: 11/102,038

(22) Filed: Apr. 8, 2005

(65) Prior Publication Data

US 2005/0224092 A1    Oct. 13, 2005

(30) Foreign Application Priority Data

Apr. 8, 2004   (DE) .................... 10 2004 017 440

(51) Int. Cl.
*B08B 3/04*   (2006.01)
(52) U.S. Cl. .................... 134/26; 134/28; 134/34; 134/36; 134/41; 134/42; 427/96; 427/304; 427/305; 427/306; 427/550; 427/551; 427/552; 427/553; 427/554
(58) Field of Classification Search .......... 134/26, 134/28, 34, 36, 41, 42; 427/96, 304, 305, 427/306, 550–554
See application file for complete search history.

(56) References Cited

U.S. PATENT DOCUMENTS

| | | | |
|---|---|---|---|
| 4,440,801 A | | 4/1984 | Aviram et al. |
| 5,022,957 A | * | 6/1991 | Copley et al. ............ 216/99 |
| 5,211,803 A | | 5/1993 | Johnson et al. |
| 5,648,125 A | * | 7/1997 | Cane ..................... 427/534 |
| 5,977,041 A | | 11/1999 | Honda |
| 6,319,564 B1 | | 11/2001 | Naundorf et al. |
| 6,350,624 B1 | * | 2/2002 | Goruganthu et al. ....... 438/5 |
| 6,673,227 B2 | | 1/2004 | Boone |
| 6,696,173 B1 | | 2/2004 | Naundorf et al. |
| 7,028,669 B2 | | 4/2006 | Nagashii et al. |
| 7,060,421 B2 | | 6/2006 | Naundorf et al. |
| 2001/0040047 A1 | | 11/2001 | Konrad et al. |
| 2002/0076911 A1 | * | 6/2002 | Lin ..................... 438/613 |
| 2002/0077259 A1 | | 6/2002 | Skee |
| 2002/0189632 A1 | * | 12/2002 | Glock et al. .............. 134/1 |
| 2003/0129371 A1 | | 7/2003 | Urakawa et al. |
| 2004/0216721 A1 | | 11/2004 | Nagashii et al. |

(Continued)

FOREIGN PATENT DOCUMENTS

DE   19851101 A1   5/1999

(Continued)

OTHER PUBLICATIONS

Abstract of JP2003318531; Nov. 7, 2003.

(Continued)

*Primary Examiner*—Sharidan Carrillo
(74) *Attorney, Agent, or Firm*—Senniger Powers LLP

(57) ABSTRACT

The present invention relates to a method for treating plastic substrates structured by means of a laser or generation of seed structures on the surface that are suitable for subsequent metallization. The substrates, after the laser structuring, are brought into contact with a process solution that is suitable for removal of the unintentional deposits that arise during the laser structuring. The treatment of the laser-structured substrates with a mixture of wetting agents and compositions that support the cleaning before metallization leads to sufficient removal of the unintentionally deposited metal seeds, without having a lasting damaging effect on the planned structured surface paths.

9 Claims, 3 Drawing Sheets

U.S. PATENT DOCUMENTS

2005/0224092 A1* 10/2005 Schildmann ............... 134/1

FOREIGN PATENT DOCUMENTS

| EP | 0377867 A2 | 7/1990 |
| EP | 1364984 A1 | 11/2003 |
| EP | 1389746 A2 | 2/2004 |
| JP | 7212008 | 8/1995 |
| JP | 8139435 | 5/1996 |
| JP | 2001339142 | 12/2001 |
| JP | 2003318531 | 11/2003 |
| KR | 1020007002981 A | 3/2001 |
| KR | 20010087784 | 9/2001 |
| KR | 1020037016717 A | 3/2004 |
| KR | 20040085071 | 10/2004 |
| WO | WO0035295 A2 * | 6/2000 |
| WO | 03005784 A2 | 1/2003 |

OTHER PUBLICATIONS

Abstract of KR 20010087784; Sep. 26, 2001.
Abstract of KR 20040085071; Oct. 7, 2004.
Abstract of JP 2001339142; Dec. 7, 2001.
Abstract of JP 7212008; Aug. 11, 1995.
Abstract of JP 8139435; May 31, 1996.
Unknown, "Laser-Activateable Plastics and Laser Devices That Deliver Flexible 3D MID Technology," Microwave Journal, May 2002, pp. 329 to 332, XP008065589.
Eβer et al., "Laser Assisted Techniques for Patterning of Conductive Tracks on Molded Interconnect Devices," Proceedings of the Technical Program, Kona, Hawaii, Feb. 10-13, 1998, pp. 225 to 233, XP 008065584.
Beitinger et al., "Design for BGA and CSP Component Standards and PCB Design Guidlines," Proceedings of the Technical Program, Providence, Rhode Island, Oct. 25-29, 1998, pp. S20-2-1 to S20-2-8, XP 008065582.
Hüske et al., "Laser Supported Activation and Additive Metallization of Thermoplastics for 3D-MIDs," Proceedings of the 3rd Lane 2001, Erlangen, Germany, Aug. 28-31, 2001, pp. 1 to 12, XP 002242586.
Feldmann et al., "Excimerlaserstrukturierung und Additive Metallisierung von Thermoplasten," Elektronik-Fertigung, 1998, pp. 150 to 154, Carl Hanser Verlag, Munich, Germany, XP 000773997.

* cited by examiner

METHOD FOR TREATING LASER-STRUCTURED PLASTIC SURFACES

CROSS-REFERENCE TO RELATED APPLICATION

This application claims the priority of Federal Republic of Germany patent application no. DE 10 2004 017 440.7, filed Apr. 8, 2004.

FIELD OF THE INVENTION

This invention concerns a method for treating plastic substrates structured on the surface by means of a laser for generation of seed structures that are suitable for subsequent metallization.

BACKGROUND OF THE INVENTION

Injection-molded circuit carriers, the so-called molded interconnect devices (MID) are currently used in many ways in the electronics industry. Such circuit carriers are designed to be three dimensional (3D-MIDs).

The goal of the 3D-MID technology is to combine electrical and mechanical functions in a single component. The circuit paths in this case are integrated into the housing and in this way replace conventional circuit boards. The weight and package size can be effectively reduced and the integration of sensors and the like is simplified.

There are various technologies for producing 3D-MIDs. Among these are two-component injection molding, hot stamping, in-mold decoration and additive or subtractive laser structuring.

U.S. Patent Application Publication No. 2004/0241422, German Patent DE 10132092, and European Patent Application EP 1 274 288 disclose methods for laser structuring of circuit paths. In this method circuit path structures are generated on an electrically nonconductive carrier material, where these paths consisting of metal seeds and a metallization subsequently applied to these seeds, where the metal seeds resulted from the raising of electrically nonconductive metal compounds that are contained in a very finely divided form in the carrier material, by electromagnetic radiation. In doing so the electrically nonconductive metal compounds are formed of thermally very stable inorganic metal compounds that are insoluble and stable in aqueous acidic or alkaline metallization baths and that remain unaltered in regions not irradiated by the laser. The inorganic metal compounds that are used are temperature resistant so that they remain stable after exposure to soldering temperatures. The circuit paths are reliable and easy to manufacture and have a very high bond strength.

However, a problem of this method is that in the laser structuring operation portions of the substrate surface and thus also the metal seeds are removed and/or destroyed because of temperature development, and can become deposited on other sites on the substrate surface. In the subsequent metallization of the circuit paths that were produced not only do the circuit path structures become metallized, but the unintentionally deposited metal seeds do as well. These unplanned deposits can lead to a degradation of the selectivity of the circuit path structures and thus to problems in the electronic components due to short circuiting.

In order to avoid these problems the distances between the structured circuit paths can be chosen to be so great that deposited metal seeds will not have any troublesome effects in the subsequent metallization. This solution to the problem, however, leads to deficient circuit densities and thus leads to great disadvantages.

SUMMARY OF THE INVENTION

Among the various aspects of the present invention, therefore, is the provision of a new method with which unintentionally deposited metal seeds can be removed from a substrate surface before metallization without permanently damaging the circuit paths already structured in accordance with plan.

Briefly, therefore, the present invention is directed to a method for treating a plastic substrate structured by a laser for the generation of seed structures on the substrate surface that are suitable for subsequent metallization. The method comprises contacting the plastic substrate with a process solution that is suitable for removal of unintentional metal seed deposits that form during laser structuring.

Other aspects and features of this invention will be in part apparent and in part pointed out hereinafter.

DETAILED DESCRIPTION OF THE PREFERRED EMBODIMENTS

Figure 1:
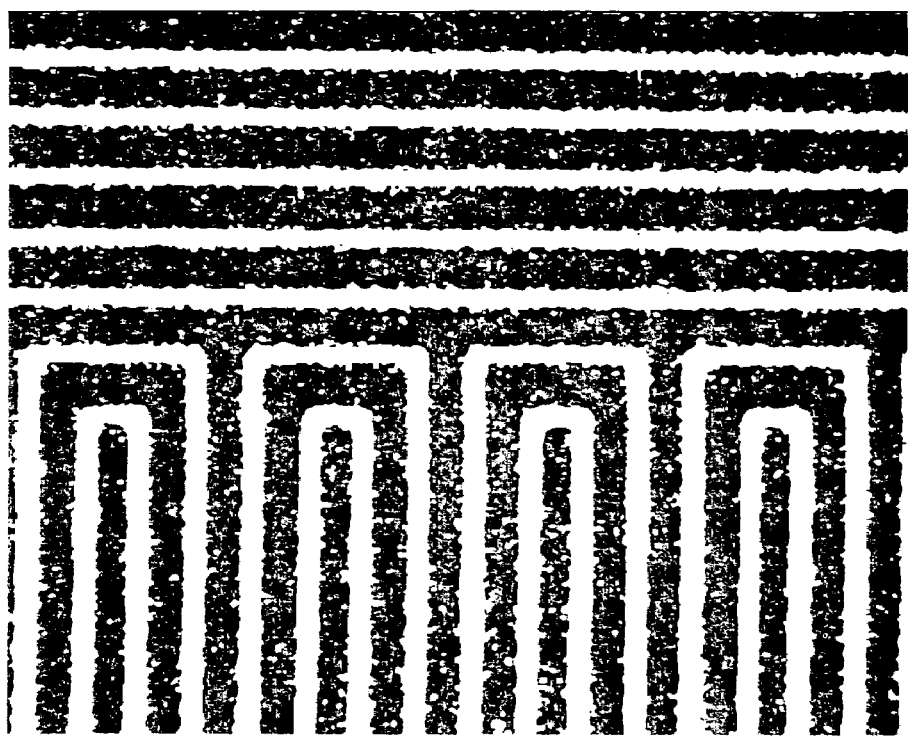
FIG. 1 shows a microscope image of the surface structure of a laser-structured plastic substrate without treatment in accordance with the invention.

This application claims the priority of Federal Republic of Germany patent application no. DE 10 2004 017 440.7, filed Apr. 8, 2004, the entire disclosure of which is incorporated herein by reference.

The present invention relates to a method for treating a plastic substrate that has been structured on the surface by a laser for generation of seed structures suitable for subsequent metallization. In accordance with the present invention, it has been discovered that after laser structuring, the plastic substrate is brought into contact with a process solution suitable for removal of unintentional deposits that originated during the laser structuring. For example, the invention involves removal of unintended metal seeds of Cu, Cr, Fe, Co, or Ni resulting from laser structuring of circuit paths where the substrate is inorganic metal oxides based on Cu, Cr, Fe, Co, Ni, and mixtures thereof embedded in thermoplastic synthetic resin material.

Surprisingly, treating the plastic substrate with a process solution comprising a mixture of wetting agents and compositions that support cleaning sufficiently removes unintentionally deposited metal seeds without having a lasting disadvantageous effect on the laser-structured circuit paths. Preferably, the compositions that support cleaning comprise neutral, acid, and alkaline cleaners (so-called "builders," i.e., substances which support the cleaning power of wetting agents in cleaners).

In certain preferred embodiments, the substrate is contacted with the process solution for between about 0.5 and about 20 minutes. For example, in one embodiment the substrate is contacted with the process solution for between about 2 and about 6 minutes.

In certain preferred embodiments, the substrate is contacted with the process solution at a temperature between about 20 and about 90° C. For example, in one embodiment the substrate is contacted with the process solution at a temperature between about 50 and about 80° C.

Comparison tests showed that alkaline compositions and acidic compositions are suitable to remove the unintentionally deposited metal seeds from the surface of the substrate. In addition, neutral compositions are also suitable to remove the unintentionally deposited metal seeds from the surface of the substrate.

Examples of alkaline compositions that may be used in accordance with the present invention include sodium hydroxide, sodium carbonate, pentasodium triphosphate, tetrasodium diphosphate, sodium gluconate, sodium metasilicate, sodium hydrogen carbonate, trisodium citrate, tetrasodium pyrophosphate, sodium tripolyphosphate and the corresponding potassium salts. In certain embodiments of the invention, it is preferable to select the acidic composition from the group consisting of $H_3PO_4$, $H_2SO_4$, methane sulfonic acid and amidosulfuric acid.

The alkaline composition is present in the process solution in a concentration between about 0.01 mol/L and about 10 mol/L. In certain preferred embodiments, the alkaline composition is present in a concentration between about 0.1 mol/L and about 2.0 mol/L. For example, in one embodiment, the alkaline composition is present in a concentration between about 0.5 mol/L and about 1.0 mol/L.

Examples of acidic compositions that may be used in accordance with the present invention include phosphoric acid, sulfuric acid, hydrochloric acid, methanesulfonic acid, citric acid, succinic acid, adipic acid, amidosulfuric acid, malonic acid, methanoic acid, ethanoic acid, propanoic acid, n-butanoic acid, n-pentanoic acid, n-hexanoic acid, oxalic acid, sodium hydrogen sulfate, potassium hydrogen sulfate, borofluoric acid. In certain embodiments of the invention, it is preferable to select the acidic composition from the group consisting of $H_3PO_4$, $H_2SO_4$, methane sulfonic acid, and amidosulfuric acid.

The acidic composition is present in the process solution in a concentration between about 0.01 mol/L and about 10 mol/L. In certain preferred embodiments, the acidic composition is present in a concentration between about 0.1 mol/L and about 2.0 mol/L. For example, in one embodiment, the acidic composition is present in a concentration between about 0.5 mol/L and about 1.0 mol/L.

Examples of suitable compositions that are neutral which may be used in accordance with the present invention include potassium sulfate, sodium sulfate, and the like. For example, one solution is $Na_3PO_4$ neutralised with $H_3PO_4$ to a pH between 6.0 and 9.5. Another solution is $K_3PO_4$ neutralised with $H_3PO_4$ to a pH between 6.0 and 9.5. The neutral composition is present in the process solution in a concentration between about 0.01 mol/L and about 10 mol/L. In certain preferred embodiments, the neutral composition is present in a concentration between about 0.1 mol/L and about 2.0 mol/L. For example, in one embodiment, the neutral composition is present in a concentration between about 0.5 mol/L and about 1.0 mol/L.

As described above, the process is supported by suitable wetting agents that are included in the process solution. Anionic wetting agents, cationic wetting agents, amphoteric wetting agents and nonionic wetting agents have proved to be suitable wetting agents. Examples of wetting agents can include one or more of the following compositions or representatives of the groups of compositions: oleyl ethoxylate, fatty alcohol ethoxylate, alkylphenol ethoxylate, phosphoric acid esters, alkylphenol ether sulfate and its sodium salt, fatty acid condensation products and their sodium salt, alkylbenzene sulfonate, alkanolamine salt, alkane sulfonate and its sodium salt, fatty amine ethoxylate, fatty alcohol alkoxylate, propylene oxide-ethylene oxide block polymers, ethylene oxide-propylene oxide block polymers, dimethyl fatty alkylbenzylammonium chloride, alkyl polyethylene glycol ethers, alkyl glucosides, oxo alcohols, coco fatty acid diethanolamide, oleic acid diethanolamide, sodium lauryl sulfate, sodium lauryl sulfosuccinate, linear alkylbenzenesulfonic acid, alkylbenzene sulfonates, alkane sulfonates, fatty alcohol sulfates, fatty alcohol ether sulfates, olefin sulfonates, ester sulfonates, alkyl phosphates, alkyl ether phosphates, fatty alcohol ethoxylates, alkyl phenol ethoxylates, fatty amine ethoxylates, fatty acid ethoxylates, fatty acid ester ethoxylates, other alkoxylates, alkanolamides, sugar surfactants, amine oxides, fluorine surfactants, alkali salts of fatty acids. In certain embodiments of the invention, it is preferable to select the wetting agent from the group consisting of alkylpolyglucoside, nonionic wetting agent based on polyoxyethylene and amphoteric wetting agent based on polyoxyethylene.

In one embodiment, ultrasound fields can be used when the substrates are brought into contact with a process solution consisting of wetting agents and compositions that support the cleaning. The use of ultrasound fields in combination with the process solution is of particular advantage and leads to improved cleaning of the substrate.

In another embodiment, to improve the cleaning of the substrate, the substrate is sequentially contacted with an alkaline cleaning process solution and an acidic cleaning process solution in any order. For example, the substrate is contacted with an acidic cleaning process solution and subsequently contacted with an alkaline cleaning process solution. Alternatively, the substrate is contacted with an alkaline cleaning process solution and subsequently contacted with an acidic cleaning process solution.

In a further embodiment, a neutral cleaning process solution is the exclusive process solution in contact with the substrate. I.e., the substrate is contacted with a neutral cleaning process solution without previously, simultaneously, or subsequently contacting the substrate with an alkaline cleaning process solution or an acidic cleaning process solution.

The following Examples set forth approaches that may be used to carry out the method of the present invention. Accordingly, these Examples should not be interpreted in a limiting sense.

EXAMPLE 1

Acidic Process Solution

Figure 2:
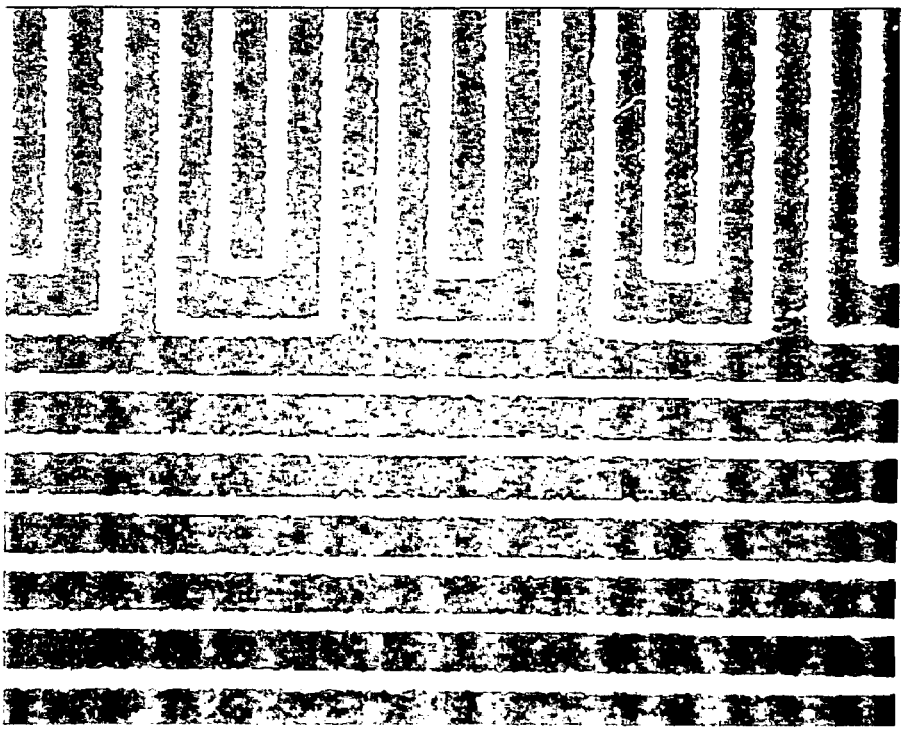
FIG. 2 shows a microscope image of the surface structure of a laser-structured plastic substrate after treatment with a process solution as in Example 1.

Treatment of a laser-structured substrate for 5 minutes at 80° C. with a solution consisting of water, phosphoric acid, a nonionic surfactant based on polyoxyethylene and an amphoteric surfactant based on polyoxyethylene. FIG. 2 illustrates a microscope image of the surface of the laser-structured plastic substrate after treatment with the acidic cleaning process solution. In comparison, a laser-structured plastic substrate without treatment in accordance with the present invention is illustrated in FIG. 1.

EXAMPLE 2

Alkaline Process Solution

Figure 3:
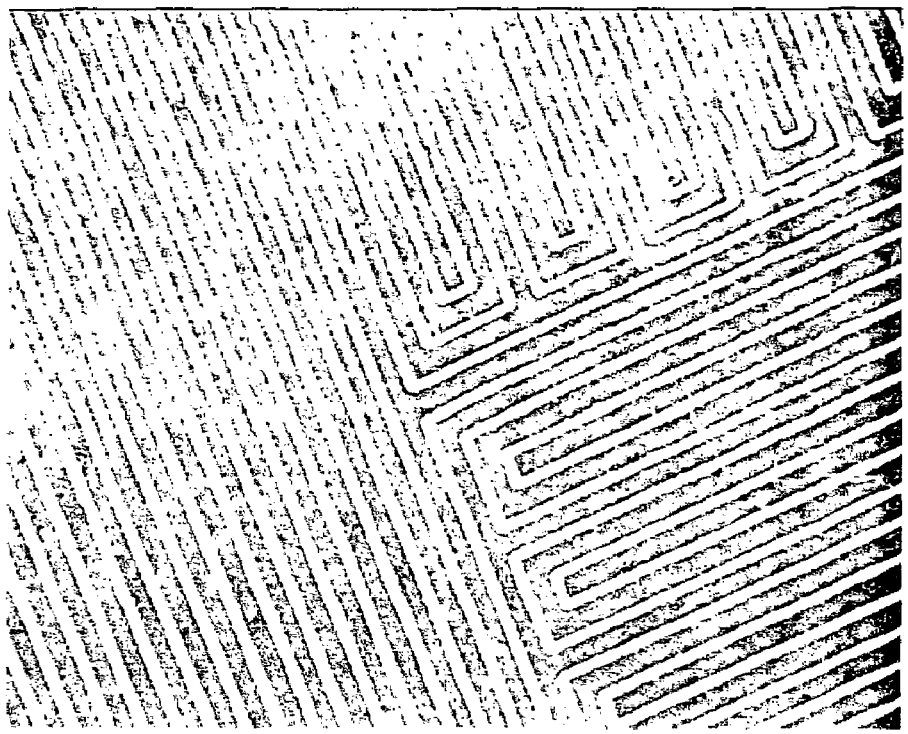
FIG. 3 shows a microscope image of the surface structure of a laser-structured plastic substrate after treatment with a process solution as in Example 2.

Treatment of a laser-structured substrate for 5 minutes at 70° C. with a process solution consisting of water, potassium hydroxide and an alkyl polyglucoside. FIG. 3 illustrates a microscope image of the surface of the laser-structured plastic substrate after treatment with the alkaline cleaning process solution. As in Example 1, a laser-structured plastic substrate without treatment in accordance with the present invention is illustrated for comparison in FIG. 1.

EXAMPLE 3

Acidic Process Solution in Conjunction with an Ultrasonic Field

Figure 4:
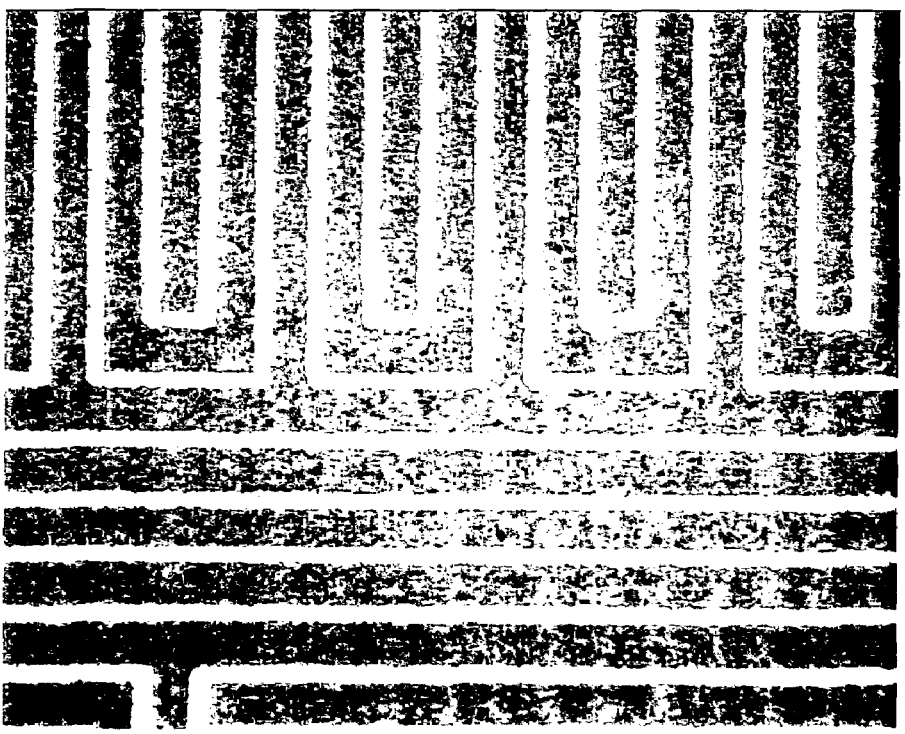
FIG. 4 shows a microscope image of the surface structure of a laser-structured plastic substrate after treatment as in Example 3.

Treatment of a laser-structured substrate with a process solution as in Example 1, but with the additional use of an ultrasound field. FIG. 4 illustrates a microscope image of the surface structure of the laser-structured plastic substrate after treatment with the acidic cleaning process solution and an ultrasonic field.

EXAMPLE 4

Alkaline Process Solution in Conjunction with an Ultrasonic Field

Figure 5:
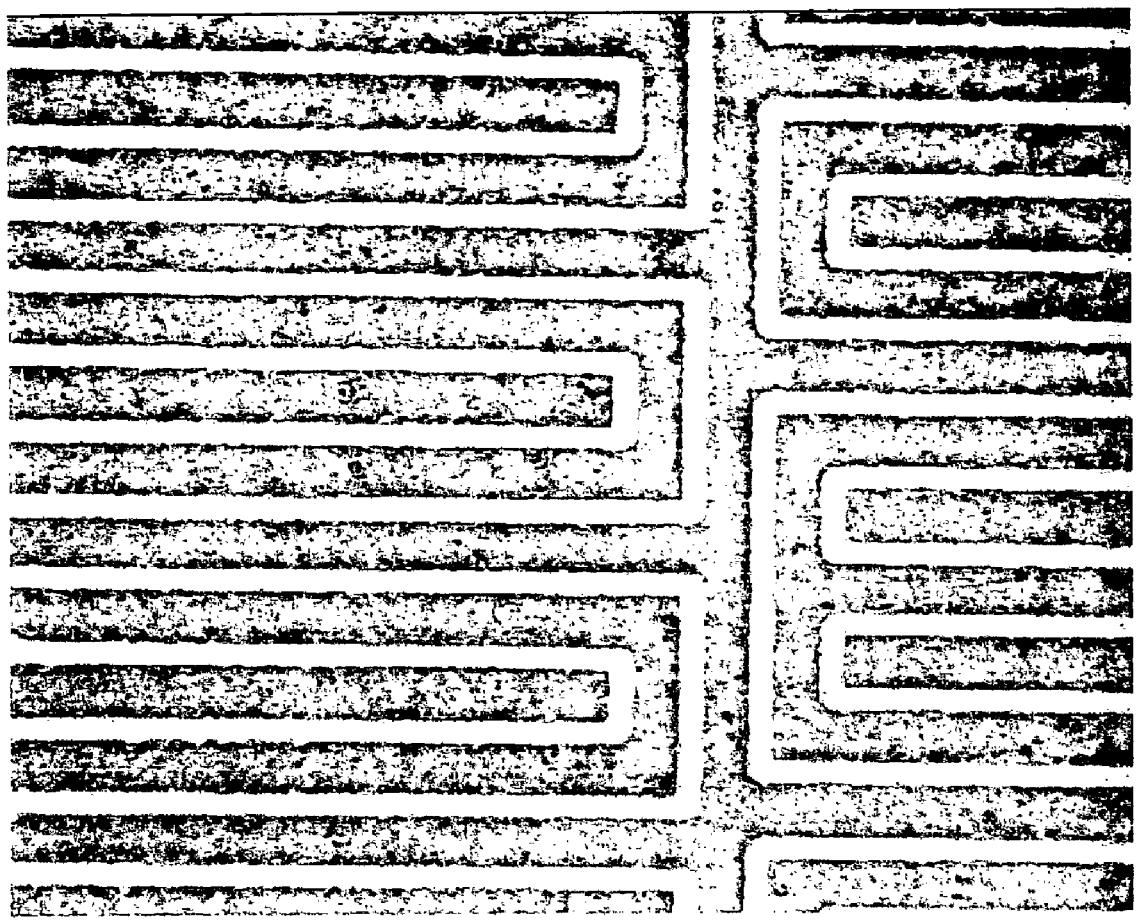
FIG. 5 shows a microscope image of the surface structure of a laser-structured plastic substrate after treatment as in Example 4.

Treatment of a laser-structured substrate with a process solution as in Example 2, but with the additional use of an ultrasound field. FIG. 5 illustrates a microscope image of the surface structure of the laser-structured plastic substrate after treatment with the alkaline cleaning process solution and an ultrasonic field.

EXAMPLE 5

Neutral Process Solution

Treatment of a laser structured part by immersion for 5 minutes at a temperature of 80° C. in a solution consisting of 30 g/L Na 3 PO 4 neutralised with $H_3PO_4$ to a pH between 6 and 9.5+6 mL/L of an alkylpolyglucoside in water.

EXAMPLE 6

Neutral Process Solution in Conjunction with an Ultrasonic Field Treatment

Treatment of a laser structured part by immersion for 5 minutes at a temperature of 80° C. in a solution consisting of 30 g/L $Na_3PO_4$ neutralized with $H_3PO_4$ to a pH between 6 and 9.5+6 mL/L of an alkylpolyglucoside in water. The treatment is carried out with ultrasonic sound at a sonic power density of 5.6 W/L.

EXAMPLE 7

Substrate in Sequential Contact with Acidic and Alkaline Process Solutions

Treatment of a laser structured part by immersion for 3 minutes at a temperature of 70° C. in a solution consisting of 0.7 mol/L $H_3PO_4$+2 g/L of an nonionic wetting agent based on polyoxyethylene+2 g/L of an amphoteric wetting agent based on polyoxyethylene in water. After a rinsing procedure the part is immersed for 3 minutes at a temperature of 70° C. in a solution consisting of 0.9 mol/L KOH+6 mL/L of an nonionic wetting agent based on alkylpolyglucoside in water.

EXAMPLE 8

Substrate in Sequential Contact with Alkaline and Acidic Solutions

Treatment of a laser structured part by immersion for 3 minutes at a temperature of 70° in a solution consisting of 0.9 mol/L KOH+6 mL/L of an nonionic wetting agent based on alkylpolyglucoside in water. After a rinsing procedure the part is immersed for 3 minutes at a temperature of 70° C. in a solution consisting of 0.7 mol/L $H_3PO_4$+2 g/L of an nonionic wetting agent based on polyoxyethylene+2 g/L of an amphoteric wetting agent based on polyoxyethylene in water.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that the several objects of the invention are achieved and other advantageous results attained.

As various changes could be made in the above methods and products without departing from the scope of the invention, it is intended that all matter contained in the above description and shown in any accompanying drawings shall be interpreted as illustrative and not in a limiting sense.

What is claimed is:

1. A method for treating a plastic substrate surface to remove unintentional metal seed deposits, the method comprising:
   contacting the plastic substrate surface with a process solution to remove said unintentional metal seed deposits;
   wherein the plastic substrate comprises a) circuit paths formed on the plastic substrate by laser structuring, and b) said unintentional metal seed deposits;
   wherein the process solution comprises water, phosphoric acid, and a mixture of at least one wetting agent; and
   wherein the at least one wetting agent is selected from the group consisting of oleyl ethoxylate, fatty alcohol ethoxylate, alkylphenol ethoxylate, phosphoric acid ester, alkylphenol ether sulfate and their sodium salts, fatty acid condensation products and their sodium salts, alkylbenzene sulfonate, alkanolamine salt, alkane sulfonate and its sodium salt, fatty amine ethoxylate, fatty alcohol alkoxylate, propylene oxide-ethylene oxide block polymer, ethylene oxide-propylene oxide block polymer, dimethyl fatty alkylbenzylammonium chloride, alkyl polyethylene glycol ether, alkyl glucosides, oxo alcohols, coco fatty acid diethanolamide, oleic acid diethanolamide, sodium lauryl sulfate, sodium lauryl sulfosuccinate, linear alkylbenzenesulfonic acid, alkylbenzene sulfonates, alkane sulfonates, fatty alcohol sulfates, fatty alcohol ether sulfates, olefin sulfonates, ester sulfonates, alkyl phosphates, alkyl ether phosphates, fatty alcohol ethoxylates, alkyl phenol ethoxylates, fatty amine ethoxylates, fatty acid ethoxylates, fatty acid ester ethoxylates, other alkoxylates, alkanolamides, sugar surfactants, amine oxides, fluorine surfactants, alkali salts of fatty acids, and mixtures thereof.

2. The method of claim 1, further comprising contacting the plastic substrate with an alkaline composition after said contacting with said process solution.

3. The method of claim 1, further comprising subjecting the plastic substrate surface to an ultrasound field while it is in contact with the process solution.

4. The method of claim 1, wherein the phosphoric acid has a concentration range between about 0.01 and about 10 mol/L.

5. The method of claim 2, wherein the alkaline composition is selected from the group consisting of sodium hydroxide, sodium carbonate, pentasodium triphosphate, tetrasodium diphosphate, sodium gluconate, sodium metasilicate, sodium hydrogen carbonate, trisodium citrate, tetrasodium pyrophosphate, sodium tripolyphosphate and the corresponding potassium salts, and mixtures thereof.

6. The method of claim 2 wherein the alkaline composition comprises between about 0.01 and about 10 mol/L of an alkaline composition selected from the group consisting of sodium hydroxide, sodium carbonate, pentasodium triphosphate, tetrasodium diphosphate, sodium gluconate, sodium metasilicate, sodium hydrogen carbonate, trisodium citrate, tetrasodium pyrophosphate, sodium tripolyphosphate and the corresponding potassium salts, and mixtures thereof.

7. The method of claim 3, wherein the phosphoric acid has a concentration range between about 0.01 and about 10 mol/L.

8. A method for treating a plastic substrate surface to remove unintentional metal seed deposits, the method comprising:
   contacting the plastic substrate surface with a process solution to remove said unintentional metal seed deposits;
   wherein the plastic substrate comprises a) circuit paths formed on the plastic substrate by laser structuring, and b) said unintentional metal seed deposits; and
   wherein said process solution comprises water, phosphoric acid, a nonionic surfactant based on polyoxyethylene, and an amphoteric surfactant based on polyoxyethylene.

9. A method for treating a plastic substrate surface to remove unintentional metal seed deposits, the method comprising:
   contacting the plastic substrate surface with a process solution to remove said unintentional metal seed deposits;
   wherein the plastic substrate comprises a) circuit paths formed on the plastic substrate by laser structuring, and b) said unintentional metal seed deposits; and
   wherein said process solution comprises water, potassium hydroxide, and an alkyl polyglucoside.

* * * * *